(12) United States Patent
Grundmann et al.

(10) Patent No.: US 7,453,169 B2
(45) Date of Patent: Nov. 18, 2008

(54) INTEGRITY TESTING OF ISOLATION MEANS IN AN UNINTERRUPTIBLE POWER SUPPLY

(75) Inventors: Steffen Grundmann, Bonstetten (CH); Nicolas Gremaud, Rüschlikon (CH)

(73) Assignee: Inventio AG, Hergiswill NW (CH)

(*) Notice: Subject to any disclaimer, the term of this patent is extended or adjusted under 35 U.S.C. 154(b) by 139 days.

(21) Appl. No.: 11/274,630

(22) Filed: Nov. 15, 2005

(65) Prior Publication Data

US 2006/0108875 A1    May 25, 2006

(30) Foreign Application Priority Data

Nov. 22, 2004  (EP) ................... 04405721

(51) Int. Cl.
*H02J 7/00* (2006.01)
*G01R 31/02* (2006.01)

(52) U.S. Cl. ........................... 307/64; 324/537
(58) Field of Classification Search ............... 307/66, 307/64, 150, 151; 324/537
See application file for complete search history.

(56) References Cited

U.S. PATENT DOCUMENTS

| | | | |
|---|---|---|---|
| 4,362,986 A | 12/1982 | Burke et al. | |
| 4,563,628 A | 1/1986 | Tietz et al. | |
| 4,763,014 A | 8/1988 | Model et al. | |
| 5,325,062 A | 6/1994 | Bachand et al. | |
| 5,548,463 A | 8/1996 | Aldridge et al. | |
| 5,684,686 A | 11/1997 | Reddy | |
| 6,157,308 A | 12/2000 | Byers | |
| 6,225,708 B1 * | 5/2001 | Furukawa et al. | 307/66 |
| 6,259,234 B1 * | 7/2001 | Perol | 323/222 |
| 6,342,791 B1 * | 1/2002 | Ichikawa et al. | 324/767 |
| 6,574,577 B2 * | 6/2003 | Stapleton et al. | 702/117 |
| 6,628,012 B2 * | 9/2003 | Reuter | 307/68 |
| 6,856,047 B2 * | 2/2005 | Murabayashi et al. | 307/150 |
| 6,967,487 B2 * | 11/2005 | Garnett | 324/537 |
| 7,057,868 B2 * | 6/2006 | Moran et al. | 361/83 |
| 2004/0039536 A1 | 2/2004 | Garnett | |

FOREIGN PATENT DOCUMENTS

| | | |
|---|---|---|
| EP | 0 309 124 | 3/1989 |
| JP | 04-147076 | 5/1992 |
| JP | 8068820 A | 3/1996 |
| JP | 2001016803 A | 1/2001 |
| WO | WO 9418739 | 8/1994 |

* cited by examiner

OTHER PUBLICATIONS

Hunter, P.L., "Fault Tolerant, Hot Pluggable Power System Design", Feb. 13, 1994, pp. 815-820, IEEE Conference Proceedings, Applied Power Electronics Conference and Exposition, Orlando, FL.

*Primary Examiner*—Michael J Sherry
*Assistant Examiner*—Michael Rutland Wallis
(74) *Attorney, Agent, or Firm*—Fraser Clemens Martin & Miller LLC; William J Clemens (57) ABSTRACT

An uninterruptible power supply wherein an isolation device is automatically tested during normal operation to ensure that it is capable of effectively isolating the input from an auxiliary power supply during emergency operation. The uninterruptible power supply includes an input for coupling to a main power supply, an output for connection to an electrical load, an auxiliary power supply and a selective isolation device configured to isolate the auxiliary power supply from the input during emergency operation. First components establish a reverse polarity across the isolation device for a test period during normal operation, and second components monitor a voltage proportional to the input voltage to the isolation device and output an error signal if the monitored voltage remains or rises above a first reference value during the test period.

12 Claims, 5 Drawing Sheets

INTEGRITY TESTING OF ISOLATION MEANS IN AN UNINTERRUPTIBLE POWER SUPPLY

BACKGROUND OF THE INVENTION

The present invention relates to uninterruptible power supplies and in particular to an apparatus and a method for testing the integrity of isolation means used in an uninterruptible power supply to isolate an auxiliary power source from a main power supply during a disruption of the main power supply.

An uninterruptible power supply (herein referred to as a "UPS") can be used to guarantee the power supply to an electrical load for a limited period in the event of a disruption to the dedicated mains electricity supply. A UPS is generally provided with an input for the mains electricity supply, an output for connection to the electrical load, a rechargeable energy storage unit, such as a battery, interconnected with the output, and a switch located between the input and the interconnected energy storage unit/output network, and a sensor detecting any disruption to the electricity supply at the input. In normal operation (e.g. non-disruption of mains power), the switch is closed and permits energy to flow from the input to the energy storage unit and the output. In emergency operation (e.g. mains power failure), the sensor detects the disruption to the electricity supply at the input and activates the switch to isolate the energy storage unit/output network from the input. Accordingly the power supply to the electrical load is maintained by the energy storage unit.

Such a UPS is described in Japanese Patent Unexamined Publication No. 04-147076 which also includes a backup-battery check circuit to detect a failure of the rechargeable battery (energy storage unit).

It is vitally important during emergency operation that the energy storage unit is always isolated from the disrupted mains electricity network since otherwise it would rapidly discharge the vast majority of its stored energy back into the mains network and thus would be incapable of maintaining the power supply to the electrical load for any appreciable length of time.

In most instances, the isolation capability of the switch is only ever tested during actual real-life situations when the UPS is called upon to switch from normal operation to emergency operation. Obviously, if the switch fails to isolate the energy storage unit from the input in these circumstances there could be catastrophic consequences when the power supply to the electrical load unexpectedly plummets and eventually fails.

A UPS is described in European EP-A-0309124 which during emergency operation detects whether an electronic isolation switch has failed, and if so, operates a mechanical isolation backup switch to isolate the entire UPS circuit from the commercial AC input. However, this purely reactive procedure is only brought into effect during emergency operation when the commercial AC power supply has already been disrupted. As such it requires the additional mechanical isolation backup switch to ensure that power is prevented from flowing from the battery into the disrupted commercial AC power supply.

SUMMARY OF THE INVENTION

An objective of the present invention is to overcome these problems by providing an uninterruptible power supply wherein the isolation means is proactively and automatically tested during normal operation to ensure that it is capable of effectively isolating the input from the output and energy storage unit during emergency operation.

This objective is achieved by providing an uninterruptible power supply comprising an input for coupling to a main power supply, an output for connection to an electrical load, a rechargeable energy storage unit adapted to be charged from the supply input, and selective isolation means configured to isolate the rechargeable energy storage unit from the input during emergency operation. The UPS further comprises first means establishing a reverse polarity across the isolation means for a test period during normal operation and second means monitoring a voltage representative of an input voltage to the isolation means and outputting an error signal if the monitored voltage remains or rises above a first reference value during the test period.

The present invention also provides a method for testing selective isolation means used in an uninterruptible power supply to isolate a rechargeable energy storage unit from an input during emergency operation, characterized by establishing a reverse polarity across the isolation means for a test period during normal operation, monitoring a voltage representative of an input voltage to the isolation means, and outputting an error signal if the monitored voltage remains or rises above a reference value during the test period.

The error signal provides an indication that the isolation means is faulty and accordingly corrective action can be taken. In reversing the polarity of the isolation means during the test period, either a) an input voltage to the isolation means is reduced below that of its output or b) the output voltage is increased above that at the input. In either case, if the isolation means is faulty, there will be a reverse current flow therethrough.

Preferably the isolation means is a diode, since a diode will automatically reverse bias and thereby assume its isolation state when its polarity is reversed. A skilled person will readily appreciate that the diode may be replaced by two diodes in series to increase the admissible reverse voltage or by two diodes in parallel to increase the admissible forward current.

Alternatively the isolation means could be a switch. In this case, a third means is required to trigger the switch into its non-conducting state during the test period.

Preferably a comparator can be used to compare a voltage at the output of the uninterruptible power supply with a further reference value and to output a test commence signal if the output voltage is greater than the further reference value. This comparator provides an excellent indication of the level to which the energy storage unit has been charged and only permits the test to commence when the energy storage unit has been sufficiently charged. Alternatively, if the test cycle is sufficiently long, the user can rely on the fact that the time period between initial power up and the first test is sufficiently large to ensure that the energy storage unit has been sufficiently charged.

Although batteries or conventional capacitor banks can be used in the uninterruptible power supply, in the preferred embodiments of the invention the rechargeable energy source is one or more supercapacitors.

In a preferred application of the present invention, the uninterruptible power supply includes an AC/DC converter at its input and is incorporated in an elevator installation between an AC mains power supply and a brake module and a controller mounted on an elevator car.

DESCRIPTION OF THE DRAWINGS

The above, as well as other, advantages of the present invention will become readily apparent to those skilled in the art from the following detailed description of a preferred embodiment when considered in the light of the accompanying drawings in which.

DESCRIPTION OF THE PREFERRED EMBODIMENT

Figure 1:
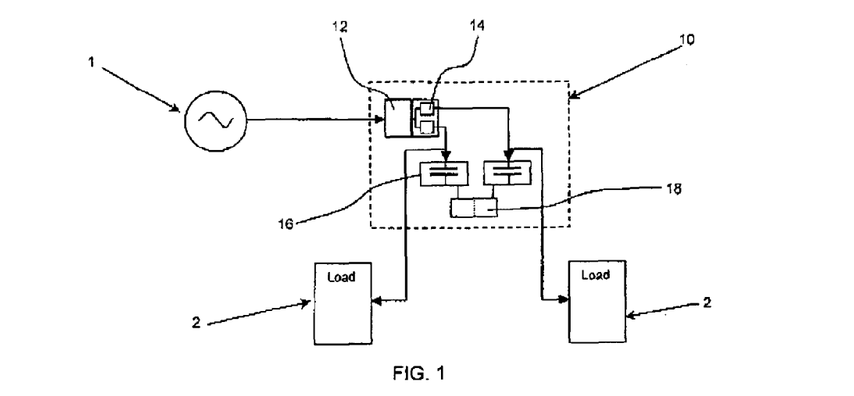
FIG. 1 is a schematic block diagram of a typical application for a UPS according to the present invention.

FIG. 1 shows a typical application for a UPS 10. In this instance the UPS 10 interconnects a mains power supply 1 with two electromagnetic brake modules 2 mounted on an elevator car within a hoistway of an elevator installation (not shown). Each module 2 is activated by an integral brake controller to frictionally engage with a guide rail in the hoistway thereby bringing the elevator car to a stop. As safe operation of the elevator clearly depends on the reliability of the power supply to the brake modules 2 and associated brake controllers, the UPS 10 is installed to guarantee this power supply. As shown, the UPS 10 contains an AC/DC converter 12, isolation means 14, two rechargeable energy storage units 16 (one per brake module 2) and one or two testers 18 to check the integrity of the isolation means 14.

Figure 2:
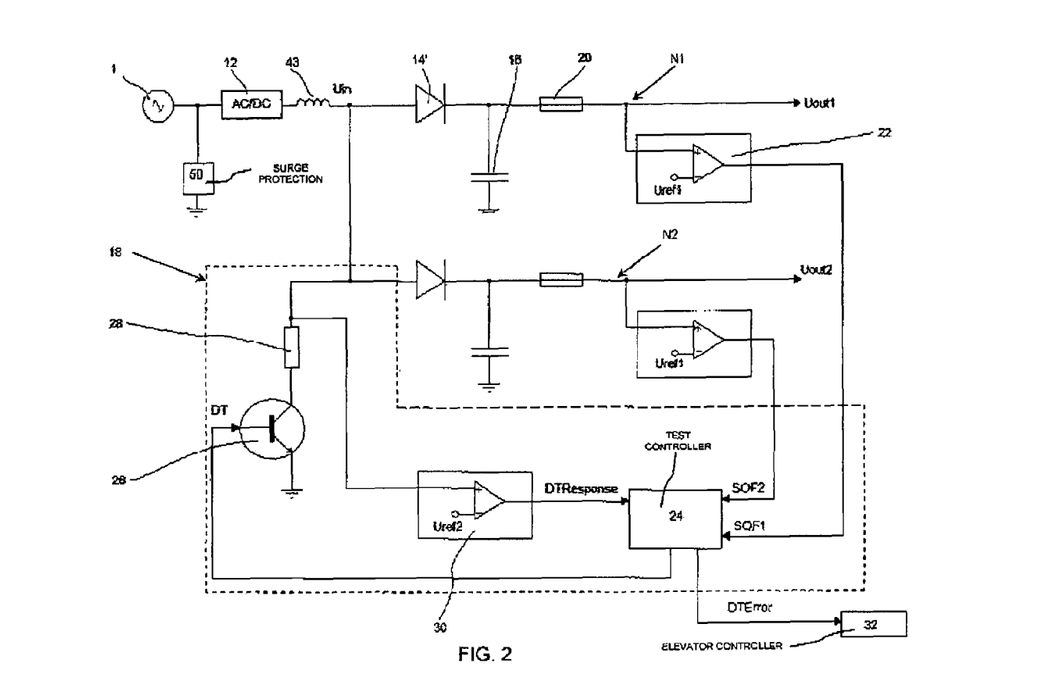
FIG. 2 is a circuit diagram of a UPS according to a first embodiment of the present invention.

A specific embodiment of the present invention is shown in detail in the circuit diagram of FIG. 2. The AC/DC converter 12 transforms the standard AC voltage (220V, 50 Hz) from the mains power supply 1 into a DC input voltage $U_{in}$ (48V) for the UPS 10. A surge protection circuit 50 protects the AC/DC converter 12 and thus the whole energy supply system against the dangerous effects of overvoltage surges in the AC mains. Furthermore, the converter 12 is current limited to 5A to protect it in the event of a short circuit. The DC input voltage $U_{in}$ delivered by the AC/DC converter 12 is passed through a choke 43 and split into two independent yet identical networks N1 and N2 each supplying a DC output voltage $U_{out}$ which is fed to the respective brake module 2 and associated controller. Each of these DC power networks N1 and N2 is provided with a serially connected diode 14' and fuse 20 as well as a rechargeable supercapacitor 16 connected in parallel. In the present embodiment the diodes 14' function as the isolation means 14. They are forward biased to permit current flow from the AC/DC converter 12 to the respective supercapacitor 16 and brake module 2, and reverse biased for current flow in the opposite direction. Accordingly, during normal operation, current flows from the mains power supply 1 through the AC/DC converter 12 and the diodes 14' to charge the supercapacitors 16 and power the brake modules 2. If there is a disruption to the mains power supply 1 causing the DC input voltage $U_{in}$ supplied by the AC/DC converter 12 to drop, the diodes 14' will automatically reverse bias and thereby prevent backflow of energy from the supercapacitors 16 into the disrupted mains power supply 1. In these circumstances, the energy stored in the supercapacitors 16 is used exclusively to maintain an effective power supply to the brake modules 2.

If the diodes 14' are overloaded then they can be subjected to degradation and electrostatic breakdown causing them to freely conduct in both directions. In these circumstances the diodes 14' would not be capable of isolating the supercapacitors 16 from a disrupted power supply 1. The following describes a test used to verify the integrity and specifically the isolation capability of the diodes 14' during normal operation of the UPS 10.

Figure 3A:
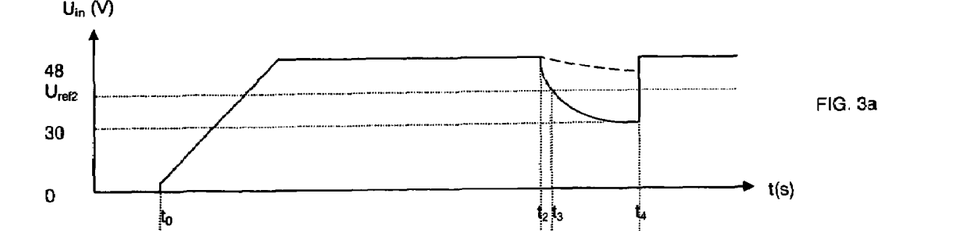
FIGS. 3a-3f are graphical representations of voltage profiles at various nodes of the circuit illustrated in FIG. 2.
Figure 3B:
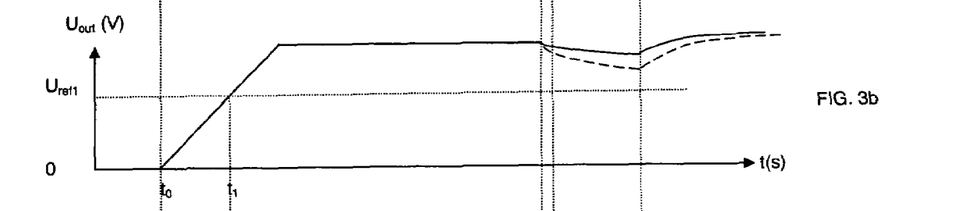

The DC output voltage $U_{out}$ of each network N1 and N2 is continually monitored by a first comparator 22. Initially, the supercapacitors 16 will be completely discharged, so when the UPS 10 is connected to the mains power supply 1 for the first time, the supercapacitors 16 will begin to charge and the output voltage $U_{out}$ on the DC networks N1 and N2 will grow linearly due to the current limitation of the AC/DC converter 12 (as shown in FIG. 3b). When the output voltage $U_{out}$ reaches a first reference value $U_{ref1}$, a signal SOF (FIG. 3c) from the comparators 22 changes state to confirm that the supercapacitors 16 have charged to a level above the first reference voltage $U_{ref1}$.

During normal operation, the integrity of the diodes 14' is periodically checked by the tester 18 which will verify whether either of the diodes 14' has broken down to permit current conduction in both directions. The tester 18 includes a test controller 24 receiving the signals SOF1 and SOF2 from the first comparators 22, a serial network of a resistor 28 and a transistor 26 connected between the output from the choke 43 and electrical ground, and a second comparator 30 also connected to the output from the choke 43 to monitor the DC input voltage $U_{in}$. The test controller 24 can be connected directly, or indirectly via the brake controller, to an elevator controller 32.

Figure 3C:
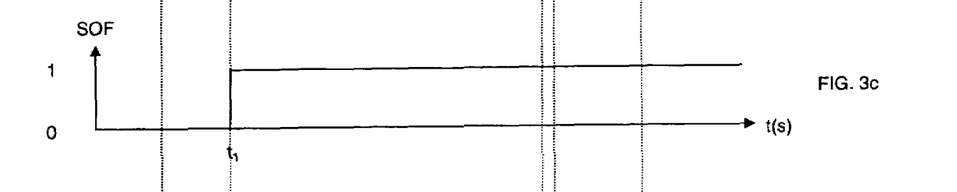

The function of the UPS 10 and specifically that of the tester 18 is described with reference to FIGS. 3a-3f, which show in simplified and exaggerated form voltage profiles at various nodes of the circuit illustrated in FIG. 2. The UPS 10 is initially connected to the mains power supply 1 at a time "$t_0$". The DC voltage input $U_{in}$ delivered by the converter 12 rises linearly to the rated voltage as shown in FIG. 3a. Current flows from the converter 12 through the diodes 14' to charge the supercapacitors 16 and the DC output voltages $U_{out}$ rise linearly as shown in FIG. 3b. When the DC output voltages $U_{out}$ reach the first reference voltage level $U_{ref1}$ at a time "$t_1$" the signals SOF from both of the first comparators 22 become active as shown in FIG. 3c and these active signals SOF instruct the test controller 24 that the test can commence.

Figure 3D:
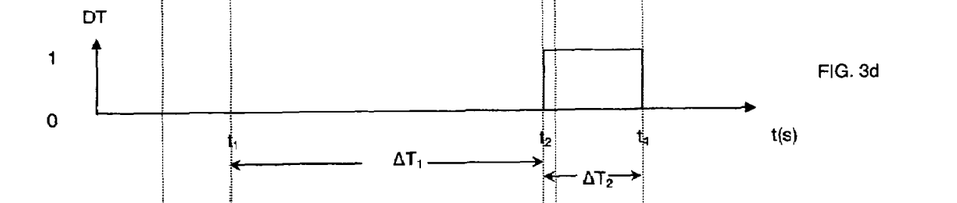
Figure 3E:
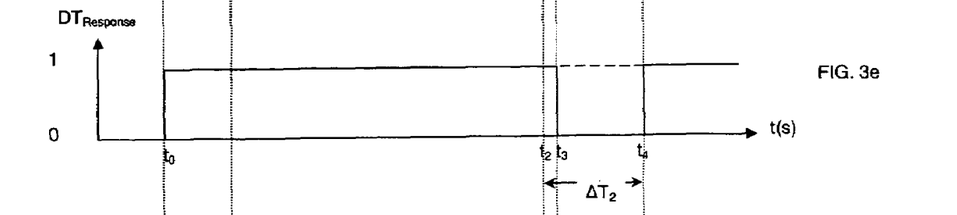
Figure 3F:
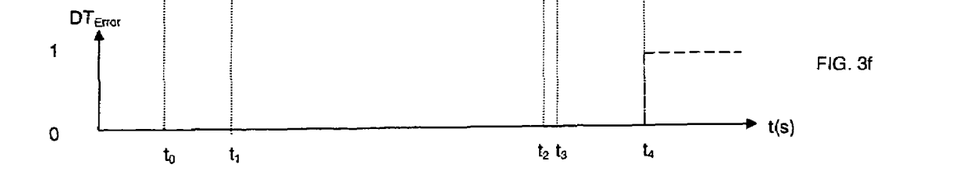

As shown in FIG. 3d, during a first period $\Delta T_1$ of the test cycle, a test signal DT from the test controller 24 to a gate of the transistor 26 remains inactive and thereby there is no conduction of current through the resistor 28 and the transistor 26. However, at a time "$t_2$" a second period $\Delta T_2$ of the test cycle commences and the test signal DT becomes active to cause saturation of the transistor 26. Accordingly, current flows directly from the converter 12 through the choke 43, the resistor 28 and the transistor 26 to ground. The resistor 28 has a resistance value of 6Ω and since the converter 12 is current limited to 5A it is clearly unable to maintain the DC input voltage $U_{in}$ at the rated value. The choke 43 effectively limits the rate of change of the current flowing from the converter 12 and therefore the DC input voltage $U_{in}$ immediately collapses.

At the onset of this collapse in the DC input voltage $U_{in}$, the diodes 14' should automatically reverse bias and therefore isolate the charged supercapacitors 16 from the converter 12, the resistor 28 and the transistor 26. In this case the DC input voltage $U_{in}$ will rapidly decay as shown by the solid line in FIG. 3*a*. Once the DC input voltage $U_{in}$ drops past the second reference voltage $U_{ref2}$ at a time "$t_3$", a signal $DT_{Response}$ from the second comparator 30 changes from an active to an inactive state as illustrated by the solid line in FIG. 3*e*.

If, on the other hand, the diodes 14' are faulty for some reason and they permit conduction in both directions, at the onset of the collapse of the DC input voltage $U_{in}$, the supercapacitors 16 will, in addition to providing the DC output voltage $U_{out}$, discharge through the diodes 14' to try to maintain the DC input voltage $U_{in}$ at its rated level. Hence, although there will be some decay in the DC input voltage $U_{in}$ as shown by the dashed line in FIG. 3*a*, this decay will not be as rapid as in the case where the diodes 14' are faultless. In these circumstances, the DC input voltage $U_{in}$ does not drop past the second reference voltage $U_{ref2}$ during the second period $\Delta T_2$ of the test cycle and therefore the signal $DT_{Response}$ from the second comparator 30 will remain in the active state illustrated by the dashed line in FIG. 3*e*.

The test controller 24 monitors the signal $DT_{Response}$ from the second comparator 30 during the second period $\Delta T_2$ of the test cycle. If there is a state transition in the signal $DT_{Response}$ from an active to an inactive state during this period $\Delta T_2$, then the controller 24 recognizes that the diodes 14' are healthy. On the contrary, if the signal $DT_{Response}$ remains active throughout this period $\Delta T_2$, then the controller 24 outputs an error signal $DT_{Error}$ to the elevator controller 32 signalling that one or both of the diodes 14' are faulty. The controller 24 may include a memory for storing the fault information gathered during the test pulse duration $\Delta T_2$ for a more convenient information transfer to the elevator controller 32 at a later time. On receipt of this error signal $DT_{Error}$, the elevator controller 32 moves the car to the nearest landing, opens the doors to allow any passengers to exit and activates the electromechanical brake modules 2 to park the car in that position. The error signal $DT_{Error}$, once established, can only be reset and the elevator restarted after the faults diode or diodes 14' have been replaced.

The entire test cycle repeats itself after time "$t_4$". In order to ensure that the test itself does not damage the diodes 14', the second period $\Delta T_2$ is generally as short as possible, typically in the region of 10 μs. The first period $\Delta T_1$ of the test cycle can be adjusted by the user to vary the frequency of the test; in some applications, the user may want to automatically test the diodes once per hour, while in other applications a test frequency of once per week may suffice.

In order to enhance the collapse in the DC input voltage $U_{in}$, a capacitor can be connected in parallel across the resistor 28.

Figure 4:
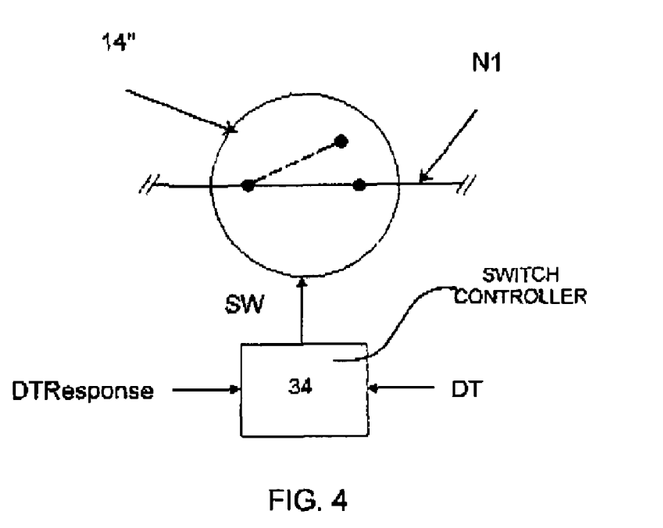
FIG. 4 is a schematic diagram of an isolation means that is an alternative to the diode of FIG. 2.

It will be readily understood that the diodes 14' of the previously described embodiment are only one type of isolation means 14 which can be used in the UPS 10. In a second embodiment of the present invention each of the diodes 14' in the circuit of FIG. 2 is substituted by a switch 14" as shown in FIG. 4. The switch 14" can be electromechanical or, preferably, a semiconductor switch such as a transistor. If an electromechanical switch 14" is used heavy loads therethrough coupled with long periods in the conducting state can cause the contacts of the switch 14" to become sticky and in an extreme example will cause the contacts to fuse permanently in the conducting state. Accordingly, in these circumstances the switch 14" will not be able to break the DC network N1 or N2 during a power disruption. If a semiconductor switch 14" is used then it is subject to the same degradation and electrostatic breakdown problems of the diodes 14' of the previous embodiment.

Whereas the diodes 14' of the previous embodiment are predisposed to conduct in one direction of current flow and isolate in the opposing direction, a signal SW must be supplied to the switch 14" to selectively make or break the DC network N1. The signal SW must cause the switch 14" to break the DC network N1 during a disruption in the mains power supply 1 as well as during the second time period $\Delta T_2$ of the test cycle.

Since the second comparator 30 already monitors the DC input voltage $U_{in}$ for the tester 18, the output $DT_{Response}$ from the second comparator 30 is also used in the present invention as an input to the switch controller 34 so as to avoid unnecessary duplication of components in the circuit. The signal DT from the test controller 24 is also fed into the switch controller 34.

The function of the switch controller 34 is illustrated in Table 1 below, wherein logic "1" refers to the switch 14" making the DC network N1 and logic "0" refers to the switch 14" breaking the DC network N1.

TABLE 1

| DT | $DT_{Response}$ | SW |
|---|---|---|
| 0 | 0 | 0 |
| 0 | 1 | 1 |
| 1 | 0 | 0 |
| 1 | 1 | 0 |

During normal operation, current flows from the mains power supply 1 through the AC/DC converter 12 and the switches 14" to charge the supercapacitors 16 and power the brake modules 2. If there is a disruption to the mains power supply 1 causing the DC input voltage $U_{in}$ supplied by the AC/DC converter 12 to drop below the second reference voltage $U_{ref2}$, then the signal $DT_{Response}$ from the second comparator 30 becomes inactive thereby causing the switch 14" to break the network N1 and preventing backflow of energy from the supercapacitors 16 into the disrupted mains power supply 1.

As in the previous embodiment, when the DC output voltages $U_{out}$ reach the first reference voltage level $U_{ref1}$ at a time "$t_1$" the signals SOF from the first comparators 22 become active as shown in FIG. 3*c* and these active signals SOF instruct the test controller 24 that the test can commence. The test follows the same procedure already described with reference to FIGS. 3*a* through 3*f*.

During the second period $\Delta T_2$ of the test cycle, the signal DT from the test controller 24 is active and holds the switch 14" in a non-conducting state while the test controller 24 monitors the signal $DT_{Response}$ from the second comparator 30. If there is a state transition in the signal $DT_{Response}$ from an active to an inactive state during this period $\Delta T_2$, then the controller 24 recognizes that the switches 14" are healthy. On the contrary, if the signal $DT_{Response}$ remains active throughout this period $\Delta T_2$ (as shown by the dashed line in FIG. 3*e*), then the controller 24 outputs the error signal $DT_{Error}$ to the elevator controller 32 signalling that one or both of the switches 14" are faulty.

It will be appreciated that the main components of the tester 18 are a) the serial network of the resistor 28 and the transistor 26 which establishes a reverse polarity across the diode 14' or the switch 14'' during the second period $\Delta T_2$ of the test cycle, b) the second comparator 30 which monitors the DC input voltage $U_{in}$ during the second period $\Delta T_2$ of the test cycle and c) the test controller 24 to trigger the transistor 26 and evaluate the response signal $DT_{Response}$ from the second comparator 30.

Figure 5:
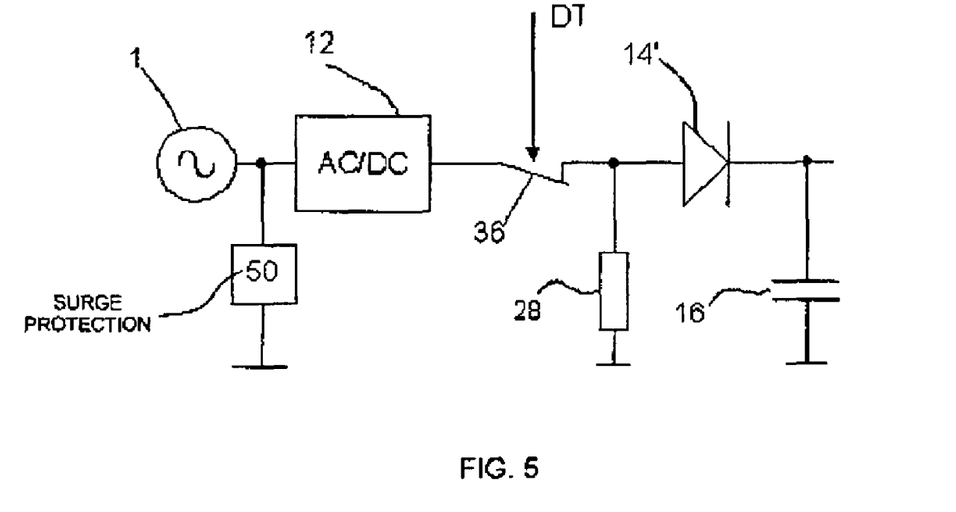
FIG. 5 is a schematic diagram of an alternative arrangement to reduce the voltage at the diode input according to the present invention.

FIG. 5 illustrates an alternative embodiment of the present invention wherein the transistor 26 used in the previous embodiments to reverse the polarity of the diode 14' by draining the DC input voltage $U_{in}$ during the second period $\Delta T_2$ is replaced by a test switch 36 located between the mains power supply 1 and the diodes 14' to completely isolate the DC networks N1 and N2 from the mains power supply 1 during this period $\Delta T_2$. Accordingly, the voltage profiles will be similar to those of FIGS. 3a through 3f during operation, the only difference being that the DC input voltage $U_{in}$ will drain through the resistor 28 towards zero instead of 30V during the second time period $\Delta T_2$ if the diodes 14' are healthy. Otherwise, the test procedure is the same as previously described. Although in this particular embodiment the test switch 36 is placed between the AC/DC converter 12 and the diodes 14', it will be appreciated that the switch 36 can be located between the mains power supply 1 and the AC/DC converter 12.

Although not shown, it will be appreciated, that a further alternative to reduce the DC input voltage $U_{in}$ during the second period $\Delta T_2$ of the test cycle would be to arrange a primary winding of a transformer between the AC/DC converter and the diode and a drain circuit comprising a secondary winding of the transformer, a resistor and a transistor serially arranged between the AC/DC converter and ground. Saturation of the transistor during the second period $\Delta T_2$ of the test cycle will cause a transient current to flow through the secondary winding in turn inducing an emf in the primary winding causing the voltage at the input of the diode to decay.

Figure 6:
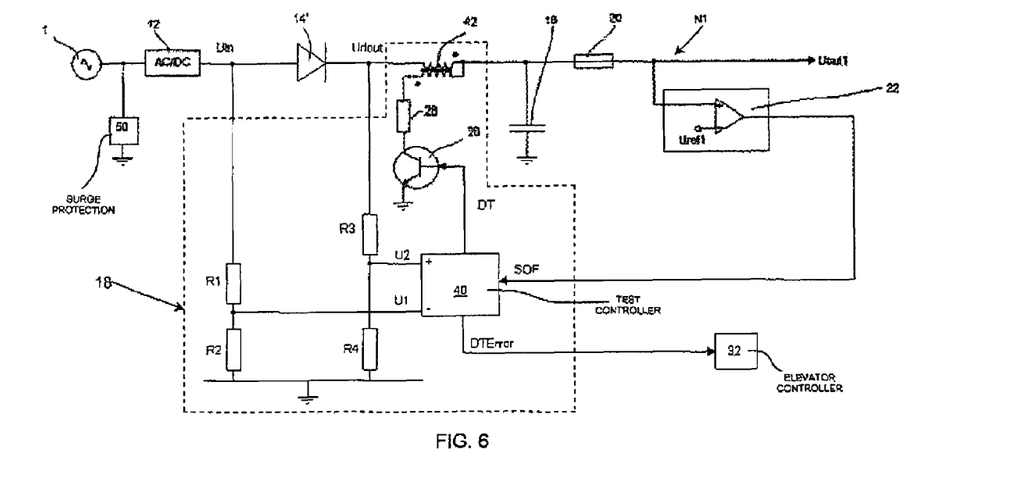
FIG. 6 is circuit diagram incorporating means to increase the voltage at the diode output and an alternative means of monitoring the diode input voltage according to the present invention.

FIG. 6 shows not only an alternative way in which to establish the reverse polarity across the diodes 14' but also an alternative means of monitoring the DC input voltage $U_{in}$ during the second period $\Delta T_2$ of the test cycle.

Instead of draining the DC input voltage $U_{in}$ to the diode 14', a transformer 42 is used to increase the DC output voltage $U_{dout}$ from the diode 14' during the second period $\Delta T_2$ of the test. A primary winding of the transformer 42 is connected between the diode 14' and the supercapacitor 16 and a secondary winding of the transformer 42 is connected in series with the resistor 28 and the transistor 26 between the supercapacitor 16 and ground.

A series network of two resistors R1 and R2 is connected between the input to the diode 14' and ground. The combined resistance of the resistors is relatively large to prevent the resistive network from draining the power supply. A first voltage $U_1$ at the junction of the two resistors R1 and R2, which is proportional to the input voltage $U_{in}$ to the diode 14', is fed into a test controller 40. Similarly, a resistive network R3 and R4 is connected to the output of the diode 14' and second junction voltage $U_2$, which is proportional to the output voltage $U_{dout}$ from the diode 14', is fed into the controller 40. The values of the resistors R1, R2, R3 and R4 are selected so that the first junction voltage $U_1$ is equal to the second junction voltage $U_2$ only when the DC output voltage $U_{dout}$ exceeds the DC input voltage $U_{in}$ by a specific voltage difference $U_{dif}$.

Figure 7A:
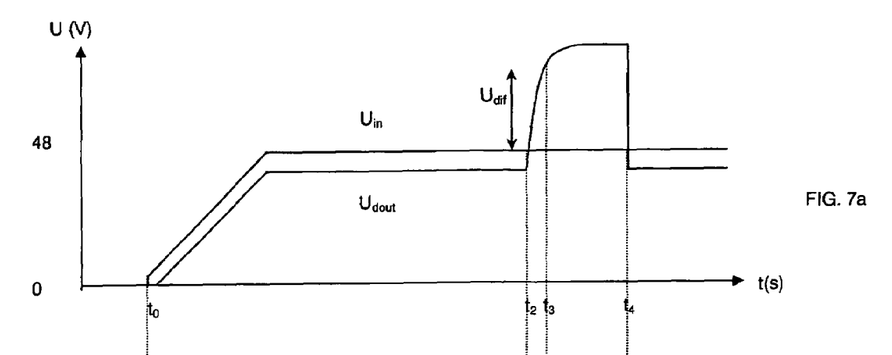
FIGS. 7a-7c are graphical representations of voltage profiles at various nodes of the circuit illustrated in FIG. 6.

During the second period $\Delta T_2$, the test signal DT from the controller 40 causes the transistor 26 to saturate and thereby current flows through a secondary winding of the transformer 42, the resistor 28 and the transistor 26. This transient current flow induces an emf in a primary winding of the transformer 42 causing the voltage $U_{dout}$ at the output of the diode 14' to increase to a value greater than the input voltage $U_{in}$ and hence the diode 14' is reverse biased. This effect is shown in exaggerated form in FIG. 7a.

Figure 7B:
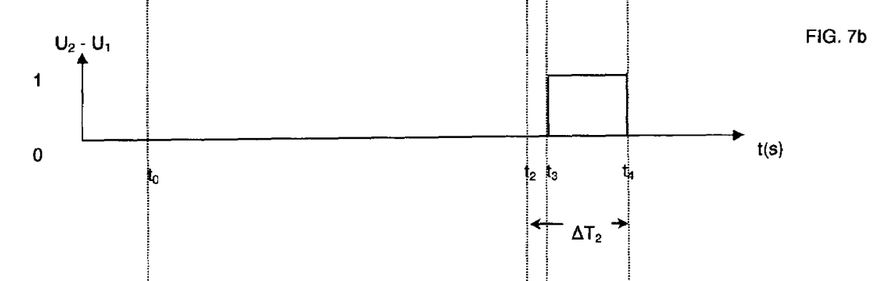

If the diode 14' is healthy, then the DC input voltage $U_{in}$ will remain at the rated value while the DC output voltage $U_{dout}$ increases. At a time "$t_3$", the DC output voltage $U_{dout}$ surpasses the DC input voltage $U_{in}$ by the specific voltage difference $U_{dif}$ and thereby a comparison of the two junction voltages $U_1$ and $U_2$ within the controller 40 produces the step function shown in FIG. 7b.

Figure 7C:
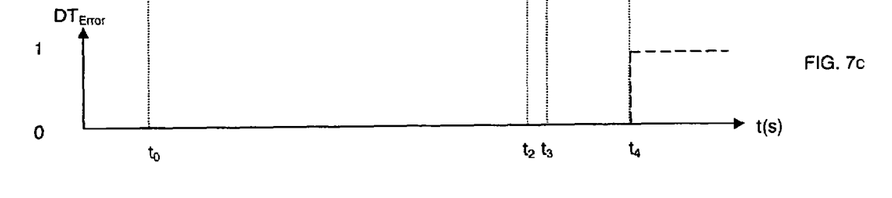

On the contrary, if the diode 14' is faulty, then current will flow through the diode 14' to equalize the DC output and input voltages $U_{in}$ and $U_{dout}$. Hence, the DC output voltage $U_{dout}$ will not exceed the DC input voltage $U_{in}$ by the specific voltage difference $U_{dif}$. Accordingly the first junction voltage $U_1$ remains greater than the second junction voltage $U_2$ throughout the second test period $\Delta T_2$ and no step function is generated from the comparison of the two junction voltages $U_1$ and $U_2$ and the controller 40 outputs an error signal $DT_{Error}$ to the elevator controller 32 as shown in FIG. 7c.

Although not shown, it will be appreciated, that a further alternative to increase the DC output voltage $U_{out}$ from the diode 14' during the second period $\Delta T_2$ of the test, would be to arrange a choke between the diode output and the supercapacitor, and a serial network of a transistor and a resistor between a voltage source which is positive with respect to the nominal voltage of the supercapacitor and the diode output. During the second test period $\Delta T_2$, the transistor will close the serial network and the voltage at the output of the diode will increase.

Furthermore, the skilled person will immediately recognize that with some modification the resistor networks R1, R2, R3 and R4 together with the controller 40 can be used to substitute the second comparator 30 and controller 24 of the embodiment illustrated in FIG. 2.

Of course, there are many other arrangements available to temporarily reverse the polarity across the isolation means 14 and many alternative means of monitoring the DC input voltage $U_{in}$ during the second period $\Delta T_2$ of the test cycle.

Although, the UPS 10 converts the AC from the mains supply 1 into usable DC for the brake modules 2, the skilled person will readily appreciate that with appropriate arrangements of AC/DC converters or DC/AC converters in the circuit, the UPS 10 can be powered from any power source AC or DC to provide a guaranteed power supply for any AC or DC application.

Furthermore, although the invention has been described with reference to a rechargeable power supply, and more particularly the supercapacitors 16, it will be appreciated that alternative auxiliary power supplies, such as second commercial mains power supplies, fuel cells, back-up generators etc., can also be used.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. An uninterruptible power supply comprising:
   a supply input adapted to be connected to a main power supply;
   an output adapted to be connected to an electrical load;
   a rechargeable energy storage unit adapted to be charged from said supply input;
   a selective isolation means connected between said supply input and said rechargeable energy storage unit for isolating said rechargeable energy storage unit from said supply input during an emergency operation;

a first means for establishing a reverse polarity across said isolation means for a test period during normal operation; and a second means for monitoring a voltage representative of an input voltage to said isolation means and outputting an error signal if the monitored voltage remains at or rises above a reference value during the test period wherein said first means includes a resistor and a transistor connected in series between an input to said isolation means and an electrical ground.

2. The uninterruptible power supply according to claim 1 including a choke connected between said supply input and an input to said isolation means.

3. An uninterruptible power supply comprising: a supply input adapted to be connected to a main power supply; an output adapted to be connected to an electrical load; a rechargeable energy storage unit adapted to be charged from said supply input; a selective isolation means connected between said supply input and said rechargeable energy storage unit for isolating said rechargeable energy storage unit from said supply input during an emergency operation; a first means for establishing a reverse polarity across said isolation means for a test period during normal operation; and a second means for monitoring a voltage representative of an input voltage to said isolation means and outputting an error signal if the monitored voltage remains at or rises above a reference value during the test period; and a resistor connected in series between an input to said isolation means and an electrical ground, and wherein said first means includes a test switch connected between a main power supply and said isolation means.

4. An uninterruptible power supply comprising: a supply input adapted to be connected to a main power supply; an output adapted to be connected to an electrical load; a rechargeable energy storage unit adapted to be charged from Said supply input; a selective isolation means connected between said supply input and said rechargeable energy storage unit for isolating said rechargeable energy storage unit from said supply input during an emergency operation; a first means for establishing a reverse polarity across said isolation means for a test period during normal operation; and a second means for monitoring a voltage representative of an input voltage to said isolation means and outputting an error signal if the monitored voltage remains at or rises above a reference value during the test period; and a transformer having a primary winding connected between an output of said isolation means and an input of said rechargeable energy storage unit, and wherein said first means includes a secondary winding of said transformer, a resistor and a transistor connected in series between said input of said rechargeable energy storage unit and an electrical ground.

5. An uninterruptible power supply comprising: a supply input adapted to be connected to a main power supply; an output adapted to be connected to an electrical load; a rechargeable energy storage unit adapted to be charged from Said supply input; a selective isolation means connected between said supply input and said rechargeable energy storage unit for isolating said rechargeable energy storage unit from said supply input during an emergency operation; a first means for establishing a reverse polarity across said isolation means for a test period during normal operation; and a second means for monitoring a voltage representative of an input voltage to said isolation means and outputting an error signal if the monitored voltage remains at or rises above a reference value during the test period, wherein said second means includes a comparator connected to an input to the isolation means for comparing the input voltage to said isolation means with the reference value and a controller monitoring an output signal from said comparator.

6. An uninterruptible power supply comprising: a supply input adapted to be connected to a main power supply; an output adapted to be connected to an electrical load; a rechargeable energy storage unit adapted to be charged from Said supply input; a selective isolation means connected between said supply input and said rechargeable energy storage unit for isolating said rechargeable energy storage unit from said supply input during an emergency operation; a first means for establishing a reverse polarity across said isolation means for a test period during normal operation; and a second means for monitoring a voltage representative of an input voltage to said isolation means and outputting an error signal if the monitored voltage remains at or rises above a reference value during the test period, wherein said second means includes a first resistor network connected between an input to said isolation means and an electrical ground to generate a voltage proportional to the input voltage, a second resistor network connected between an output of said isolation means and the electrical ground to provide the reference value which is proportional to a voltage at an output of said isolation means, and a controller comparing the voltage proportional to the input voltage with the reference value.

7. The uninterruptible power supply according to claim 1 including a comparator comparing a voltage at an output of said uninterruptible power supply with a further reference value and outputting a test commence signal if the output voltage is greater than the further reference value.

8. The uninterruptible power supply according to claim 2 including a comparator comparing a voltage at an output of said uninterruptible power supply with a further reference value and outputting a test commence signal if the output voltage is greater than the further reference value.

9. The uninterruptible power supply according to claim 3 including a comparator comparing a voltage at an output of said uninterruptible power supply with a further reference value and outputting a test commence signal if the output voltage is greater than the further reference value.

10. The uninterruptible power supply according to claim 4 including a comparator comparing a voltage at an output of said uninterruptible power supply with a further reference value and outputting a test commence signal if the output voltage is greater than the further reference value.

11. The uninterruptible power supply according to claim 5 including a comparator comparing a voltage at an output of said uninterruptible power supply with a further reference value and outputting a test commence signal if the output voltage is greater than the further reference value.

12. The uninterruptible power supply according to claim 6 including a comparator comparing a voltage at an output of said uninterruptible power supply with a further reference value and outputting a test commence signal if the output voltage is greater than the further reference value.

* * * * *